United States Patent
Kim et al.

(10) Patent No.: US 9,867,283 B2
(45) Date of Patent: Jan. 9, 2018

(54) PACKAGE BOARD AND PREPREG

(71) Applicant: Samsung Electronics Co., Ltd., Suwon-si, Gyeonggi-do (KR)

(72) Inventors: Jin-gyu Kim, Asan-si (KR); Hyun Lee, Busan (KR); Dong-han Kim, Osan-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/197,736

(22) Filed: Jun. 29, 2016

(65) Prior Publication Data

US 2017/0064818 A1 Mar. 2, 2017

(30) Foreign Application Priority Data

Aug. 28, 2015 (KR) ........................ 10-2015-0121826

(51) Int. Cl.
| | |
|---|---|
| H05K 1/03 | (2006.01) |
| H05K 1/02 | (2006.01) |
| H01L 23/498 | (2006.01) |
| H01L 21/48 | (2006.01) |
| H05K 3/00 | (2006.01) |

(52) U.S. Cl.
CPC ....... H05K 1/0271 (2013.01); H01L 21/4846 (2013.01); H01L 23/49838 (2013.01); H05K 1/03 (2013.01); H05K 3/0011 (2013.01); H05K 2201/029 (2013.01); H05K 2201/0293 (2013.01)

(58) Field of Classification Search
CPC .. H05K 1/00; H05K 1/02; H05K 1/03; H05K 1/05; H05K 1/09; H05K 1/11; H05K 1/16; H05K 1/18; H05K 3/00; H05K 3/10; H05K 3/30; H05K 3/36; H05K 3/40; H05K 3/42; H05K 3/46
USPC ....... 174/255, 250, 251, 254, 256–264, 266; 428/209, 212, 217, 156, 413, 417, 418, 428/623; 442/229, 348, 381, 387, 394, 442/415, 419; 257/72, 700, 702
See application file for complete search history.

(56) References Cited

U.S. PATENT DOCUMENTS

| | | | | |
|---|---|---|---|---|
| 3,617,613 | A | * 11/1971 | Benzinger | ............... B29C 70/00 156/299 |
| 3,638,573 | A | * 2/1972 | Campbell | ................. B32B 3/12 102/364 |
| 4,461,800 | A | * 7/1984 | Tanaka | ................. B30B 15/061 100/295 |
| 4,707,565 | A | * 11/1987 | Kasai | ................... H05K 1/0366 174/255 |

(Continued)

FOREIGN PATENT DOCUMENTS

| | | |
|---|---|---|
| KR | 100601495 B1 | 7/2006 |
| KR | 100775353 B1 | 11/2007 |

(Continued)

*Primary Examiner* — Xiaoliang Chen
(74) *Attorney, Agent, or Firm* — Renaissance IP Law Group LLP

(57) ABSTRACT

A package board includes a stack structure that includes a circuit layer and a fiber layer. The fiber layer includes at least one first fiber that extends in a first direction and is a non-woven fiber. Also, a prepreg includes a first fiber that is a non-woven fiber; a plurality of second fibers that are spaced apart from the first fiber and are woven fibers; and an insulating layer that fills gaps between the first fiber and the plurality of second fibers.

12 Claims, 15 Drawing Sheets

(56) References Cited

U.S. PATENT DOCUMENTS

| | | | | |
|---|---|---|---|---|
| 4,882,089 A * | 11/1989 | Iwaskow | H01B 1/22 | 252/502 |
| 5,047,279 A * | 9/1991 | Nasu | B29B 15/08 | 361/748 |
| 5,103,293 A * | 4/1992 | Bonafino | H01L 23/145 | 174/256 |
| 5,378,869 A * | 1/1995 | Marrs | H01L 23/49827 | 219/121.71 |
| 5,690,837 A * | 11/1997 | Nakaso | H05K 3/0055 | 216/17 |
| 5,729,423 A * | 3/1998 | Donde | H01L 21/6831 | 361/234 |
| 5,888,627 A * | 3/1999 | Nakatani | B32B 27/12 | 174/264 |
| 5,906,042 A * | 5/1999 | Lan | H01L 23/5382 | 257/E23.171 |
| 6,245,696 B1 * | 6/2001 | Haas | B29C 70/885 | 174/258 |
| 6,258,449 B1 * | 7/2001 | Nagasawa | H01L 23/3735 | 174/257 |
| 6,281,446 B1 * | 8/2001 | Sakamoto | H01L 23/13 | 174/255 |
| 6,416,232 B1 * | 7/2002 | Sasaki | G02B 6/28 | 385/55 |
| 6,455,784 B1 * | 9/2002 | Kinoshita | C08K 5/34924 | 174/255 |
| 6,479,136 B1 * | 11/2002 | Nakanishi | H05K 1/056 | 174/258 |
| 6,530,147 B1 * | 3/2003 | Haas | H05K 1/0373 | 216/65 |
| 6,712,525 B1 * | 3/2004 | Kawase | G02B 6/3608 | 156/285 |
| 7,041,357 B2 | 5/2006 | Hsieh et al. | | |
| 7,071,424 B1 * | 7/2006 | Shirai | H05K 3/421 | 174/263 |
| 7,537,668 B2 | 5/2009 | Watanabe | | |
| 7,843,057 B2 | 11/2010 | Alger et al. | | |
| 7,884,484 B2 | 2/2011 | Yamano et al. | | |
| 8,313,984 B2 | 11/2012 | Topacio et al. | | |
| 8,569,631 B2 * | 10/2013 | Doneker | H05K 1/0216 | 174/256 |
| 8,895,358 B2 | 11/2014 | Lin | | |
| 2001/0052425 A1 * | 12/2001 | Andoh | H05K 3/4069 | 174/262 |
| 2002/0023343 A1 * | 2/2002 | Oka | H01L 21/486 | 29/846 |
| 2002/0034913 A1 * | 3/2002 | Curro | A47L 1/15 | 442/381 |
| 2002/0054739 A1 * | 5/2002 | Kawase | G02B 6/3608 | 385/59 |
| 2003/0138187 A1 * | 7/2003 | Kawase | G02B 6/3608 | 385/14 |
| 2004/0040738 A1 * | 3/2004 | Tani | H05K 3/4641 | 174/250 |
| 2004/0151882 A1 * | 8/2004 | Tani | H05K 1/056 | 428/209 |
| 2004/0170795 A1 * | 9/2004 | Haas | B32B 7/06 | 428/41.8 |
| 2004/0188134 A1 * | 9/2004 | Sato | H05K 3/4655 | 174/255 |
| 2005/0014035 A1 * | 1/2005 | Nakagiri | C08J 5/046 | 174/110 FC |
| 2005/0014437 A1 * | 1/2005 | Yoshida | B29C 43/003 | 442/415 |
| 2005/0136233 A1 * | 6/2005 | Samuels | D21H 27/30 | 428/212 |
| 2005/0218503 A1 * | 10/2005 | Abe | H01L 23/49822 | 257/700 |
| 2006/0016553 A1 * | 1/2006 | Watanabe | H05K 3/205 | 156/272.2 |
| 2006/0068671 A1 * | 3/2006 | Yoshida | B30B 15/061 | 442/394 |
| 2007/0215381 A1 * | 9/2007 | Vasoya | H05K 3/4641 | 174/262 |
| 2007/0287021 A1 * | 12/2007 | Takeuchi | C08G 59/504 | 428/623 |
| 2008/0011507 A1 * | 1/2008 | Vasoya | H05K 3/4608 | 174/260 |
| 2008/0047737 A1 * | 2/2008 | Sahara | H05K 1/186 | 174/254 |
| 2008/0058744 A1 * | 3/2008 | Tippey | A61F 13/42 | 604/361 |
| 2009/0052835 A1 * | 2/2009 | Okazaki | H05K 1/0271 | 385/14 |
| 2009/0218118 A1 * | 9/2009 | Tani | H01L 23/5389 | 174/256 |
| 2009/0229874 A1 * | 9/2009 | Katagiri | H05K 3/0035 | 174/262 |
| 2009/0236138 A1 * | 9/2009 | Katagiri | H05K 3/0035 | 174/262 |
| 2010/0007942 A1 * | 1/2010 | Oikawa | G02F 1/167 | 359/296 |
| 2011/0175102 A1 * | 7/2011 | Hatano | H01L 51/5243 | 257/72 |
| 2011/0278051 A1 * | 11/2011 | Himori | H05K 3/4069 | 174/257 |
| 2011/0290549 A1 * | 12/2011 | Hirai | H05K 3/4069 | 174/264 |
| 2012/0090883 A1 * | 4/2012 | Bchir | H01L 23/49894 | 174/258 |
| 2012/0199376 A1 * | 8/2012 | Konya | H01B 7/0838 | 174/117 F |
| 2013/0037310 A1 * | 2/2013 | Kimura | C08J 5/24 | 174/251 |
| 2014/0061891 A1 | 3/2014 | Kim et al. | | |
| 2014/0090878 A1 * | 4/2014 | Adachi | H05K 1/036 | 174/255 |
| 2014/0216794 A1 * | 8/2014 | Hibino | H05K 3/429 | 174/255 |
| 2014/0251656 A1 * | 9/2014 | Ikeda | H05K 3/4676 | 174/251 |
| 2014/0335355 A1 * | 11/2014 | Ettin | D01D 5/0885 | 428/373 |
| 2015/0107886 A1 | 4/2015 | Kim et al. | | |

FOREIGN PATENT DOCUMENTS

| | | |
|---|---|---|
| KR | 100926675 B1 | 11/2009 |
| KR | 20140030889 A | 3/2014 |
| KR | 20150044781 A | 4/2015 |
| KR | 20150046609 A | 4/2015 |
| KR | 20150047348 A | 5/2015 |

* cited by examiner

PACKAGE BOARD AND PREPREG

CROSS-REFERENCE TO RELATED APPLICATION

This application claims the benefit of Korean Patent Application No. 10-2015-0121826, filed on Aug. 28, 2015, in the Korean Intellectual Property Office, the disclosure of which is incorporated herein in its entirety by reference.

BACKGROUND

The inventive concept relates to a package board and prepreg, and more particularly, to a package board that includes fibers and a prepreg.

Miniaturization of semiconductor packages has resulted in reduced thicknesses of package substrates. Accordingly, the thicknesses of a circuit layer, an insulating layer, and a core layer that are included in the package substrate are also reduced.

SUMMARY

The inventive concept provides a package board and a prepreg used to solve warpage of a substrate as a thickness of a package board decreases.

According to an aspect of the inventive concept, a package board is provided that includes: a stack structure including a circuit layer and a fiber layer, wherein the fiber layer includes at least one first fiber that extends in a first direction and is a non-woven fiber.

The fiber layer may not include woven fibers.

The fiber layer may include a first region, which overlaps a region where a circuit pattern is formed within the circuit layer, and a second region, which overlaps a region where the circuit pattern is not formed within the circuit layer. The first fiber may be formed in the second region.

The first direction may be substantially a same in which a first side of the package substrate extends, and the second region may include edge portions that are adjacent to the first side and a second side parallel to the first side.

The first side may be a long side of the package board.

The first region may include a plurality of second fibers that are woven fibers.

A specific stiffness in the first direction of the first fiber may be greater than a specific stiffness in the first direction of the plurality of second fibers.

The first fiber and the plurality of second fibers may be spaced apart from each other, a diameter of the first fiber may be equal to a first diameter, a diameter of each of the second fibers may be equal to a second diameter, and distances between the first fiber and the plurality of second fibers may be equal to or less than a smaller diameter from among the first diameter and the second diameter.

The package board may further include a plurality of first fibers. The plurality of first fibers may be spaced apart from each other and extend substantially parallel to each other, the diameter of each of the first fibers may be equal to a first diameter, and a distance between adjacent first fibers of the plurality of first fibers may be equal to or less than the first diameter.

The package board may further include a plurality of first fibers, wherein the plurality of first fibers may be arranged at levels in a second direction that is substantially perpendicular to a main surface of the fiber layer.

The plurality of first fibers may include a first-level fiber formed at a first level and a second-level fiber formed at a second level that is different from the first level, and a first axis of the first level fiber may not overlap a second axis of the second level fiber in the second direction.

The at least one first fiber may include at least two first-axis fibers which have a first axis extending in the first direction as a central axis and are arranged in a discontinuous, segmented.

The package board may further include a plurality of first fibers, wherein at least one of the plurality of first fibers may include at least two second-axis fibers that have a second axis extending in the first direction as a central axis and may be arranged in a discontinuous, segmented manner, and a gap section including the at least two first-axis fibers that are arranged in a discontinuous, segmented manner may not overlap a gap section that includes the at least two second-axis fibers that are arranged in a discontinuous, segmented manner in a direction that is substantially perpendicular to the first direction.

The package board may further include a plurality of first fibers, wherein at least one of the plurality of fiber layers may not comprise a woven fiber, and at least one of the plurality of fiber layers may include a plurality of second fibers that are woven fibers.

According to another aspect of the inventive concept, there is provided a prepreg including: a first fiber that is a non-woven fiber; a plurality of second fibers that are spaced apart from the first fiber and are woven fibers; and an insulating layer that fills gaps between the first fiber and the plurality of second fibers.

According to yet another aspect of the inventive concept, a package board comprises: a circuit layer comprising a first side and a second side that is opposite from the first side; and a fiber layer comprising at least one non-woven fiber extending in a first direction that is substantially parallel to a direction of the first and second sides.

In one embodiment, the circuit layer further comprises a third side and a fourth side that is opposite the third side in which the third and fourth sides extend in a direction that is substantially perpendicular to the direction of the first and second sides, in which a length of the first side is substantially equal to a length of the second side, and a length of the third side is substantially equal to a length of the fourth side, and in which the respective lengths of the first side and the second side are greater than or equal to the respective lengths of the third and fourth sides.

In another embodiment, the circuit layer further comprises a third side and a fourth side that is opposite the third side in which the third and fourth sides extend in a direction that is substantially perpendicular to the direction of the first and second sides, in which a length of the first side is substantially equal to a length of the second side, and a length of the third side is substantially equal to a length of the fourth side, and in which the respective lengths of the first side and the second side are less than the respective lengths of the third and fourth sides.

In yet another embodiment, the fiber layer further comprises a plurality of woven fibers extending in the first direction and in a second direction that is substantially perpendicular to the first direction.

In still another embodiment, the package board further comprises a plurality of non-woven fibers that are arranged in a discontinuous segmented manner in the fiber layer.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1A:
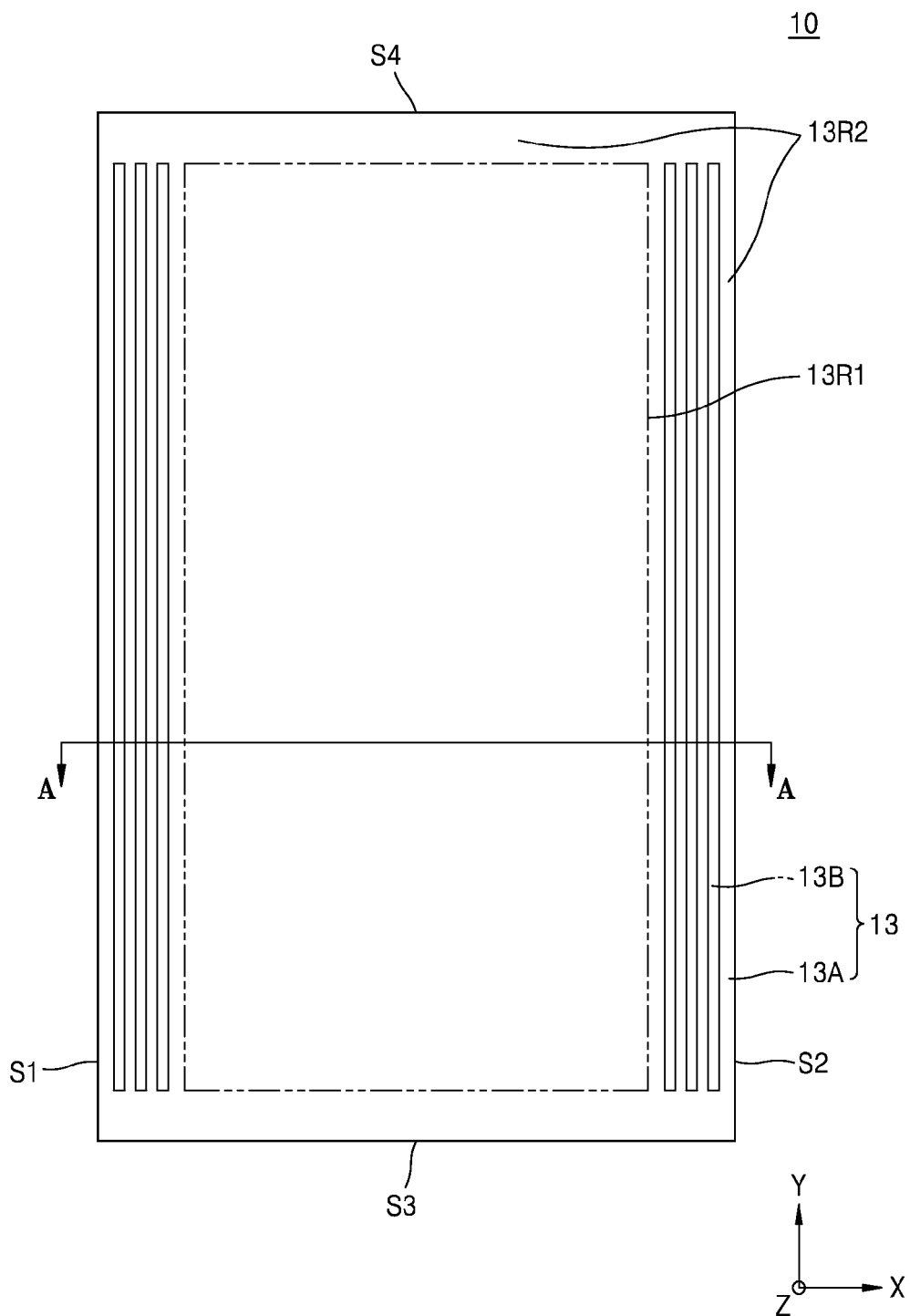
FIGS. 1A and 1B respectively are a plan view and a cross-sectional view of a package board according to one or more exemplary embodiments.

Hereinafter, the inventive concept will be described in detail by explaining exemplary embodiments of the inventive concept with reference to the attached drawings in which like reference numerals in the drawings denote like elements.

The inventive concept may, however, be embodied in many different forms and should not be construed as being limited to the embodiments set forth herein; rather, these embodiments are provided so that this disclosure will be thorough and complete, and will fully convey the concept of the inventive concept to those skilled in the art.

It will be understood that although the terms first and second are used herein to describe various elements, regions, layers, sections, and/or components, these elements, regions, layers, sections, and/or components should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment may be implemented differently, a specific process sequence may be performed differently from the described order. For example, two consecutively described processes may be performed substantially at the same time or performed in an order that is opposite to the order that is described.

Exemplary embodiments of the inventive concept are described herein with reference to the attached drawings. As such, variations from the shapes of the illustrations as a result, for example, of manufacturing techniques and/or tolerances, are to be expected. Thus, exemplary embodiments of the inventive concept should not be construed as limited to the particular shapes of regions illustrated herein, but are to include deviations in shapes that result, for example, from manufacturing.

Figure 1B:
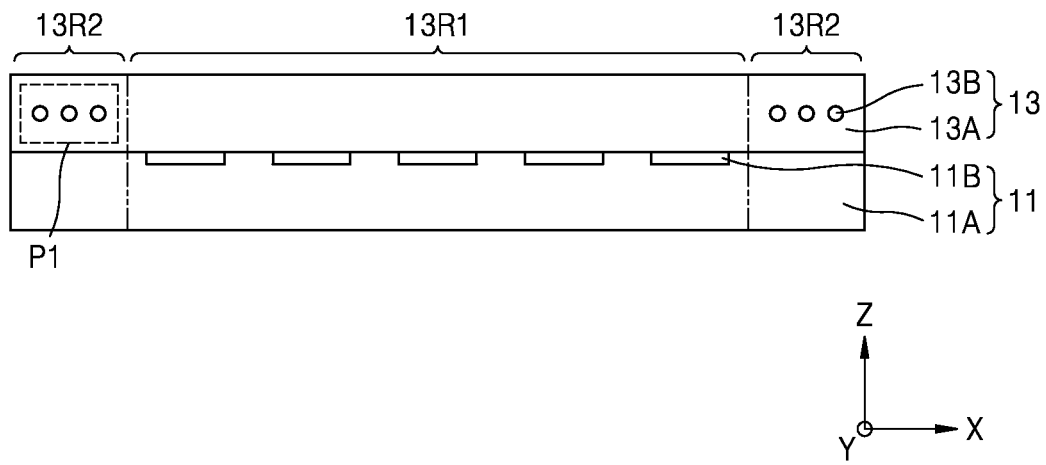
Figure 1C:
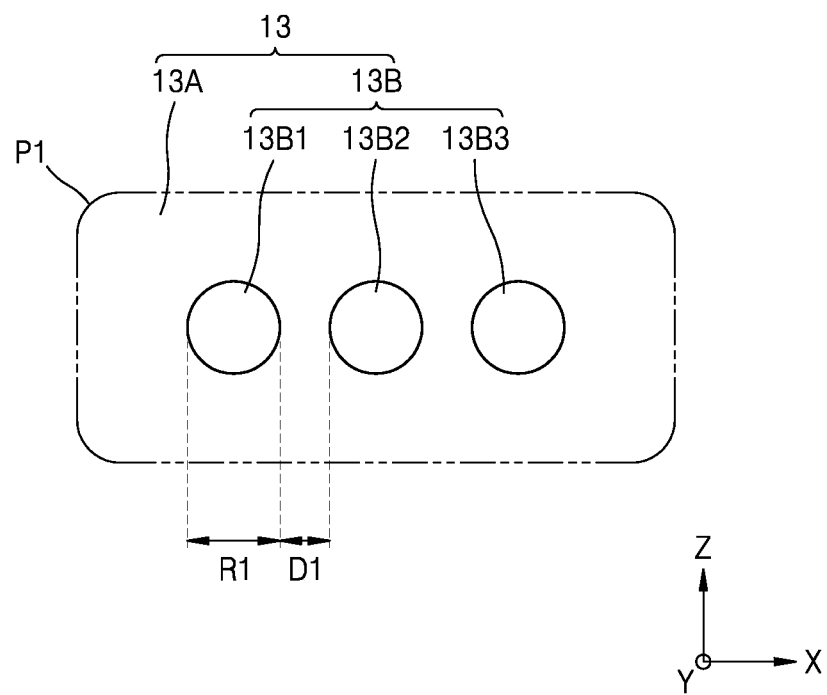
FIG. 1C is a cross-sectional view depicting an area P1 of the package board indicated in FIG. 1B.

FIGS. 1A and 1B respectively are a plan view and a cross-sectional view of a package board 10 according to one or more exemplary embodiments. FIG. 1B illustrates a main part of a cross-section taken along a line A-A of FIG. 1A. FIG. 1C is a cross-sectional view depicting an area P1 of the package board 10 indicated in FIG. 1B.

Referring to FIGS. 1A and 1B, the package board 10 may include a circuit layer 11 and a fiber layer 13 forming a stack structure with the circuit layer 11. The circuit layer 11 may include a circuit pattern 11B. and a first insulating layer 11A in which the circuit pattern 11B is formed. The fiber layer 13 may be formed on the circuit layer 11. Although not illustrated, the fiber layer 13 may include an open area for electrically connecting the circuit pattern 11B to the outside. That is, the fiber layer 13 may include an open area for electrically connecting the circuit pattern to one or more electrical connections that are external to the package board 10. The fiber layer 13 may include a second insulating layer 13A covering an exposed surface of the circuit pattern 11B, and a first fiber 13B within the second insulating layer 13A. The first fiber 13B may extend in a first direction (a Y direction) along an axis located at the center thereof. The fiber layer 13 may include a plurality of first fibers 13B, and the first fibers 13B may be arranged to extend in the first direction (the Y direction) in parallel or substantially parallel to each other. The first fibers 13B may be non-woven fibers.

The first fibers 13B, which are arranged in parallel to each other in the first direction (the Y direction) within the second insulating layer 13A, increase a bending stiffness of the package board 10 in the first direction (the Y direction). That is, the first fibers 13B may reduce or alleviate warpage of the package board 10 in the first direction (the Y direction). Therefore, problems such as non-wetting between the package board 10 and components of semiconductor devices (not shown), which are arranged on the package board 10 and electrically connected to each other, caused by warpage of the package board 10 may be reduced or alleviated, and warpage issues arising handling of the package board 10 during and between processes of manufacturing may be reduced.

In detail, the package board 10 may be a board for a semiconductor package on which semiconductor devices are arranged. The package board 10 may be a printed circuit board (PCB). The package board 10 may have a first side S1 and a second side S2 that are opposite from each other and extend in the first direction (the Y direction), and a third side S3 and a fourth side S4 that are opposite from each other and extend in a second direction (an X direction) that is perpendicular or substantially perpendicular to the first direction (the Y direction). The first side Si and the second side S2 are long sides of the package board 10, and the third side S3 and the fourth side S4 are short sides of the package board 10.

The circuit board 11 may include the first insulating layer 11A and the circuit pattern 11B. The first insulating layer 11A is formed to fill respective gaps and spaces between the circuit patterns 11B.

The circuit patterns 11B may be densely arranged in a central portion of the first insulating layer 11A. The central portion of the first insulating layer 11A may be a certain distance from the first to fourth sides S1 to S4, but the inventive concept is not limited thereto. That is, the central portion of the first insulating layer 11A may be spaced away from the first to fourth sides S1 to S4. The circuit patterns 11B may be arranged in one or more selected areas of the first insulating layer 11A. In some exemplary embodiments, a central portion of the first insulating layer 11A may include regions where the circuit patterns 11B are not formed at relatively large intervals. That is, a central portion of the first insulating layer 11A may include regions where the circuit patterns 11B are formed with spaces between the circuit patterns 11B. In this case, the circuit patterns 11B may be densely arranged in regions adjacent to edge portions of the first insulating layer 11A, which will be described below with reference to FIGS. 7A and 7B.

The circuit pattern 11B may be electrically connected to one or more semiconductor devices (not shown) arranged on the package board 10. In this case, a semiconductor device may be electrically connected to the circuit pattern 11B via open areas formed in the fiber layer 13 or the first insulating layer 11A. A conductive structure may be formed in the open area to form the circuit pattern 11B. Multiple semiconductor devices may be arranged on the package board 10 and may be respectively connected to the circuit pattern 11B.

The fiber layer 13 covers the exposed surface of the circuit pattern 11B and the first insulating layer 11A. In one embodiment, the second insulating layer 13A may be a solder resist layer. The fiber layer 13 may be divided into a first region 13R1 and second region 13R2 based on whether the fiber layer 13 overlaps the circuit pattern 11B in a third direction (a Z direction) of the fiber layer 13. The first region 13R1 may be a region where the fiber layer 13 overlaps the circuit pattern 11B, and the second region 13R2 may be a region where the fiber layer 13 does not overlap the circuit pattern 11B. In this case, the fiber layer 13 may be formed in the second regions 13R2. Accordingly, the open area formed in the fiber layer 13 may be easily formed without any structure of the first fiber 13B. The open area may be used to electrically connect the circuit pattern 11B to the outside. That is, the open area may be used to electrically connect the circuit pattern 11B to one or more electrical connections that are external to the package board 10.

The circuit patterns 11B may be formed on one or more central regions of the first insulating layer 11A, which is a certain distance from the first to fourth sides S1 to S4 of the package board 10. That is, the one or more central region of the first insulating layer 11A may be spaced apart from the first to fourth sides S1 to S4 of the package board 10. Therefore, the first region 13R1 may be one or more central regions of the fiber layer 13 that are each a certain distance from the first to fourth sides S1 to S4 of the package board 10. Also, the second regions 13R2 are regions of the fiber layer 13 that are different from the first region 13R1 and may be edge portions that are adjacent to the first to fourth sides S1 to S4. In this case, the first fiber 13B may be formed in the second regions 13R2 that are adjacent to the first to fourth sides S1 to S4. Therefore, the first fiber 13B may be arranged so not to overlap the circuit pattern 11B in the third direction (the Z direction). Accordingly, the fiber layer 13 may have an open area without any structure of the first fiber 13B. The open area may be used to electrically connect the circuit pattern 11B to the outside. That is, the open area may be used to electrically connect the circuit pattern 11B to one or more electrical connections that are external to the package board 10.

The first fiber 13B may extend along a long side of the package board 10. That is, the first fiber 13B may extend in the first direction (the Y direction), which is the direction in which the first side S1 and the second side S2 having relatively long lengths and extend. Accordingly, bending or warpage of the package board 10, which occurs in the direction in which the first side S1 and the second side S2 having relatively long lengths extend, may effectively be minimized or prevented. In some exemplary embodiments, the first direction (the Y direction) in which the first fiber 13B extends is the same as the first side S1 of the package board 10, and the second regions 13R2 in which the first fiber 13B is formed may include edge portions that are adjacent to the first side S1 and the second side S2.

In the drawings, the first fiber 13B is shown as being formed only in the edge portions of the second region 13R2 that is adjacent to the first side S1 and adjacent to the second side S2, which are the long sides of the package board 10, but the inventive concept is not limited thereto. In some exemplary embodiments, the first fiber 13B may be formed in edge portions of the second region 13R2 that is adjacent to the third side S3 and adjacent to the fourth side S4, which are short sides of the package board 10. In this case, the first fiber 13B may extend in the second direction (the X direction), which is the same direction in which the third side S3 and the fourth side S4 of the package board 10 extend. Accordingly, bending or warpage of the package board 10 in the second direction (the X direction) may be minimized or prevented. The minimization or prevention of the bending or warpage is further described below with reference to FIG. 8.

There may be multiple first fibers 13B extending in parallel or substantially parallel to one another. The first fibers 13B may be non-woven fibers. That is, the fiber layer 13 may not include fibers that extend in different directions from each other and that are woven together.

In some exemplary embodiments, the fiber layer 13 may further include woven fibers in addition to the first fibers 13B that are arranged in parallel to one another and that are not woven together. In this case in which the fiber layer 13 includes woven fibers, the fiber layer 13 may increase stiffness of the package board 10 overall. The increase in the stiffness will be described below with reference to FIGS. 5A and 5B.

Referring to FIG. 1C, the fiber layer 13 may include the second insulating layer 13A and the first fibers 13B formed in the second insulating layer 13A. The first fibers 13B may include, for example, first to third single fibers 13B1 to 13B3. The first to third single fibers 13B1 to 13B3 may be spaced apart from each other as they extend in a parallel manner so that the spacing is maintained or substantially maintained over their respective lengths. However, in some exemplary embodiments, the first to third single fibers 13B1 to 13B3 may contact each other.

The first to third single fibers 13B1 to 13B3 may be formed from the same material and thus may have substantially the same coefficient of thermal expansion. Also, the first to third single fibers 13B1 to 13B3 may have substantially the same diameter R1 and substantially the same length. Accordingly, although the package board 10 including the first to third single fibers 13B1 to 13B3 undergoes a thermal reflow process, bending or warpage of the package board 10 caused by a difference between the coefficients of thermal expansion of the first to third single fibers 13B1 to 13B3 may be reduced or prevented. In another embodiment, the materials, diameters, lengths, etc. of the first to third single fibers 13B1 to 13B3 may be selected to be different so that the bending or warpage of the package board 10 does not occur or is substantially prevented.

A distance D1 between neighboring fibers among the first to third single fibers 13B1 to 13B3 may be substantially the same as or smaller than the diameter R1 of the first to third single fibers 13B1 to 13B3. The first fibers 13B may be formed in the second region 13R1 of FIGS. 1A and 1B, that is, in a region where the fiber layer 13 overlaps the circuit pattern 11B by decreasing the distance D1 between neighboring fibers. As the number of first fibers 13B per unit volume increases, bending stiffness of the package board 10 in the first direction (the Y direction) may correspondingly increase. In some exemplary embodiments, the distance D1 between neighboring fibers among the first to third single fibers 13B1 to 13B3 may be substantially the same as a distance D1 between other neighboring fibers among the first to third single fibers 13B1 to 13B3, but the inventive concept is not limited thereto.

FIG. 1C shows an area P1 that is indicated in FIG. 1B, and the first fibers 13B formed in a region adjacent to the first side S1 may be symmetrical or substantially symmetrical to the first fibers 13B formed in a region adjacent to the second side S2.

FIGS. 1A to 1C show that three first fibers 13B are respectively included in the regions adjacent to the first side S1 and the second side S2, but the inventive concept is not limited thereto. The number of first fibers 13B formed in each of the first side S1 and the second side S2 may be greater than or less than three. When multiple first fibers 13B are formed, the first fibers 13B are sequentially arranged such that the first fibers 13B are at the same level from the main surface of the fiber layer 13 or, alternatively, the first fibers 13B may have a stack structure in which the first fibers 13B are at different levels. Such an embodiment will be described below with reference to FIGS. 2A to 3C.

In some exemplary embodiments, the package board 10 may further include a core layer (not shown) in addition to the circuit layer 11 and the fiber layer 13. The core layer may increase stiffness of the package board 10 and may include an insulating layer and fibers impregnated with the insulating layer. In this case, the fibers may extend in different directions from each other and may be woven together. The fiber layer may be formed by processing a prepreg. That is, the fiber layer may be formed by processing a reinforcing fabric that has been pre-impregnated with resin.

Figure 1D:
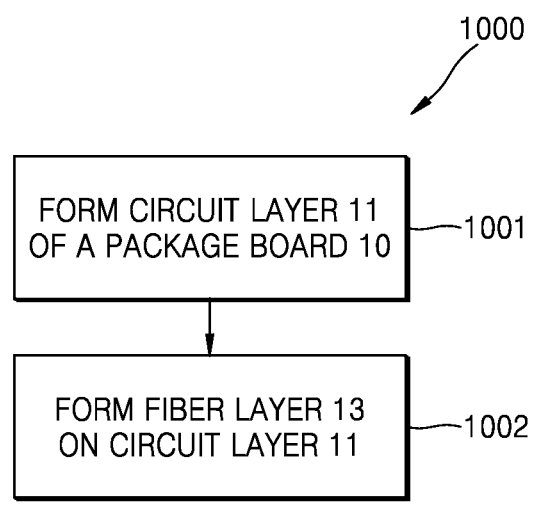
FIG. 1D is a flow diagram for a process of forming a package board according to an embodiment.

FIG. 1D is a flow diagram for a process 1000 of forming a package board 10 according to an embodiment. A method of manufacturing the package board 10 is as described below. At operation 1001, the circuit patterns 11B are formed on the circuit layer 11 using well-known techniques. At operation 1002, the fiber layer 13 is formed on the circuit layer 11. The fiber layer 13 may be formed by sequentially forming a first preliminary insulating layer on the circuit layer 11 and a second preliminary insulating layer on the first fiber 13B, and then pressing the circuit layer 11, the first preliminary insulating layer and the second preliminary insulating layer together. In this case, the first fibers 13B are arranged to extend in the first direction (the Y direction) in the second regions 13R2 as described above. The first preliminary insulating layer and the second preliminary insulating layer may be used to form the second insulating layer 13A.

The first insulating layer 11A and the second insulating layer 13A may include resin composites and may selectively include fillers. For example, the first insulating layer 11A and the second insulating layer 13A may include epoxy resin, polyimide resin, bismaleimide triazine (BT) resin, Flame Retardant 4 (FR-4), FR5, ceramic, silicon, and/or glass, but the inventive concept is not limited thereto. The first insulating layer 11A may have a single-layer structure or multilayer structure in which wire patterns are additionally included. For example, the first insulating layer 11A may be a rigid flat panel or may be formed by attaching rigid flat panels to each other or by attaching a thin flexible board to a rigid flat panel. The first fiber 13B may be a carbon fiber, an aramid fiber and/or a glass fiber.

FIGS. 1A to 1C show that the package board 10 may include the circuit layer 11 and the fiber layer 13, but the package board 10 may further include additional circuit layers, fiber layers and other functional layers that are not shown.

The package board 10 may be an array package board. The array package board may indications of single boards for separate packages that are connected to form an array. A plurality of single boards for separate packages may be made by separating the array package to form a resulting electronic device. Edge portions of the package board 10 may remain empty for easy handling the package board 10.

Figure 2A:
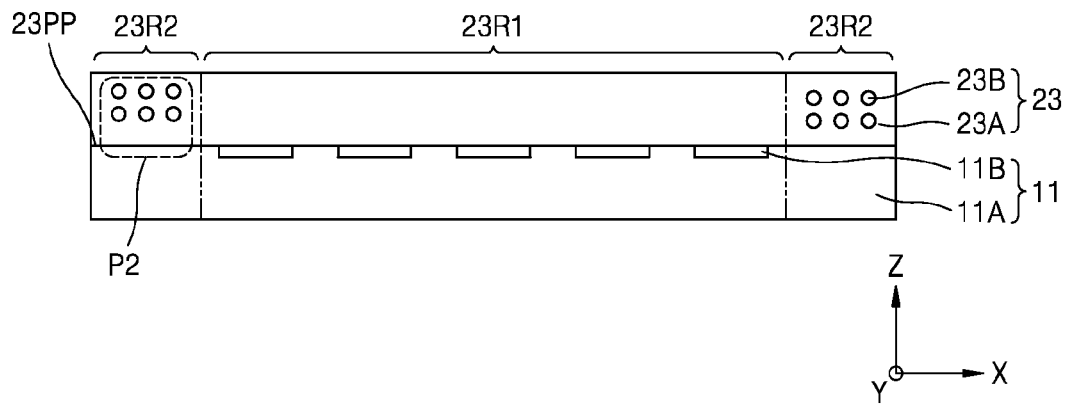
FIG. 2A is a cross-sectional view of a package board according to an exemplary embodiment.
Figure 2B:
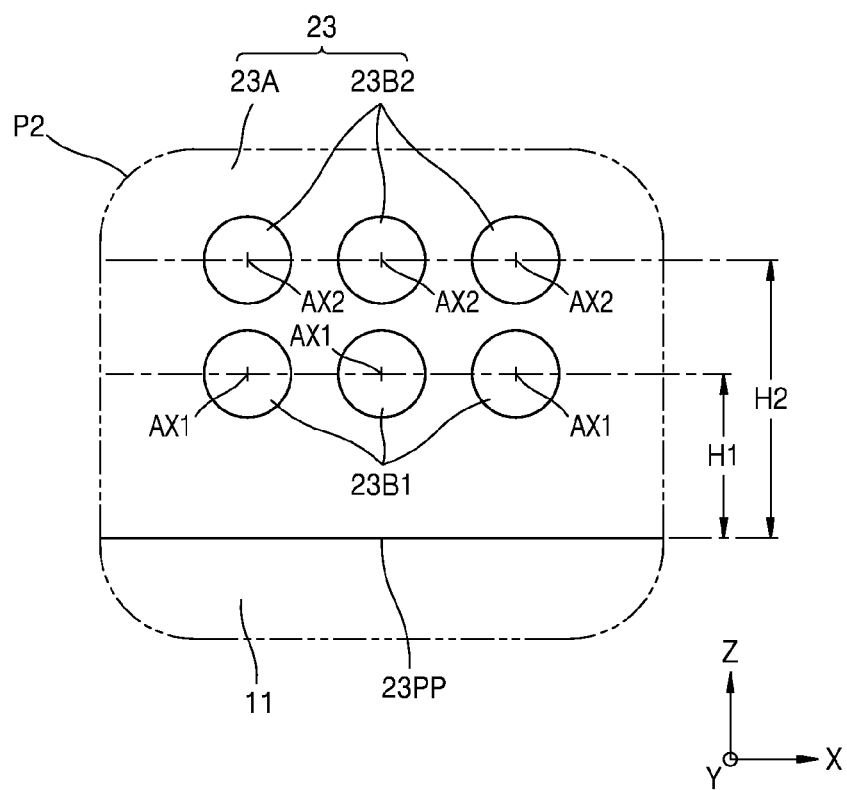
FIG. 2B is a cross-sectional view depicting an area P2 of the package board indicated in FIG. 2A.

FIG. 2A is a cross-sectional view of a package board 20 according to an exemplary embodiment. FIG. 2B is a cross-sectional view depicting an area P2 of the package board 20 indicated in FIG. 2A. The package board 20 is similar to the package board 10 of FIGS. 1A to 1C, but is different from the package board 10 insofar as first fibers 23B of the package board 20 are arranged at different levels H1 and H2. Like reference numbers in the drawings denote like elements, and repeated elements may be only briefly described.

Referring to FIGS. 2A and 2B, the package board 20 may include a circuit layer 11 and a fiber layer 23 forming a stack structure with the circuit layer 11.

The circuit layer 11 may include the circuit patterns 11B and the first insulating layer 11A in which the circuit patterns 11B are enclosed. The circuit layer 11 may have the structure described above with reference to FIGS. 1A to 1C. That is, the circuit patterns 11B may be densely arranged in a central portion of the first insulating layer 11A, which is a certain distance from the edge portions of the circuit layer, but the inventive concept is not limited thereto. The circuit patterns 11B may be variously arranged based on the particular circuit connections of the circuit patterns 11B.

The fiber layer 23 may be formed on the circuit layer 11. The fiber layer 23 may include a second insulating layer 23A covering the circuit layer 11 and the first fibers 23B within the second insulating layer 23A. The first fibers 23B may be spaced apart from and be arranged in parallel or substantially parallel to each other in a first direction (the Y direction). The first fibers 23B may be the non-woven fibers.

The fiber layer 23 may be divided into a first region 23R1 that overlaps a region where the circuit patterns 11B are formed, and second regions 23R2 that are different from the first region 23R1. In this case, the first fibers 23B may be sequentially arranged at different levels in the second regions 23R2 in a third direction (the Z direction) that is perpendicular or substantially perpendicular to a main surface 23PP of the fiber layer 23.

The second regions 23R2 arranged on both sides of the first region 23R1 may each include, for example, six first fibers 23B. The six first fibers 23B may be first-level fibers 23B1 and second-level fibers 23B1. The first-level fibers may have respective first axes AX1, which are central axes and which are located at a first level H1 from the main surface 23PP of the fiber layer 23. The second-level fibers 23B2 may have respective second axes AX2, which are central axes and which are located at a second level H2 that is higher than the first level H1. In this case, the first axes AX1 and the second axes AX2 may overlap each other in the third direction (the Z direction), but the inventive concept is not limited thereto.

FIGS. 2A and 2B show that three first fibers 23B are respectively arranged at two levels H1 and H2 in one of the second regions 23R2 that are arranged on both sides of the first region 23R1, but the inventive concept is not limited thereto. In some exemplary embodiments, the number of first fibers 23B may be different from six, and the first fibers 23B may be arranged at three or more levels.

Figure 3A:
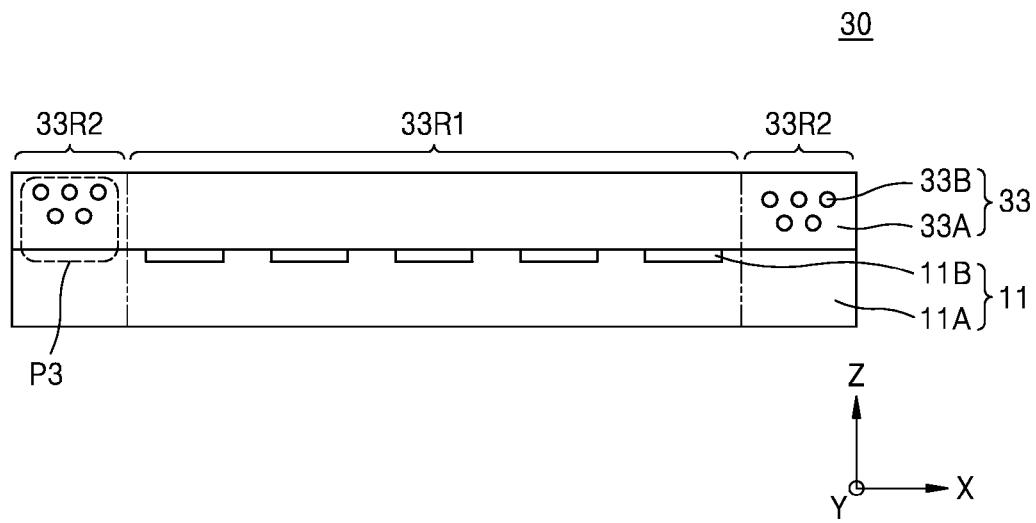
FIG. 3A is a cross-sectional view of a package board according to an exemplary embodiment.
Figure 3B:
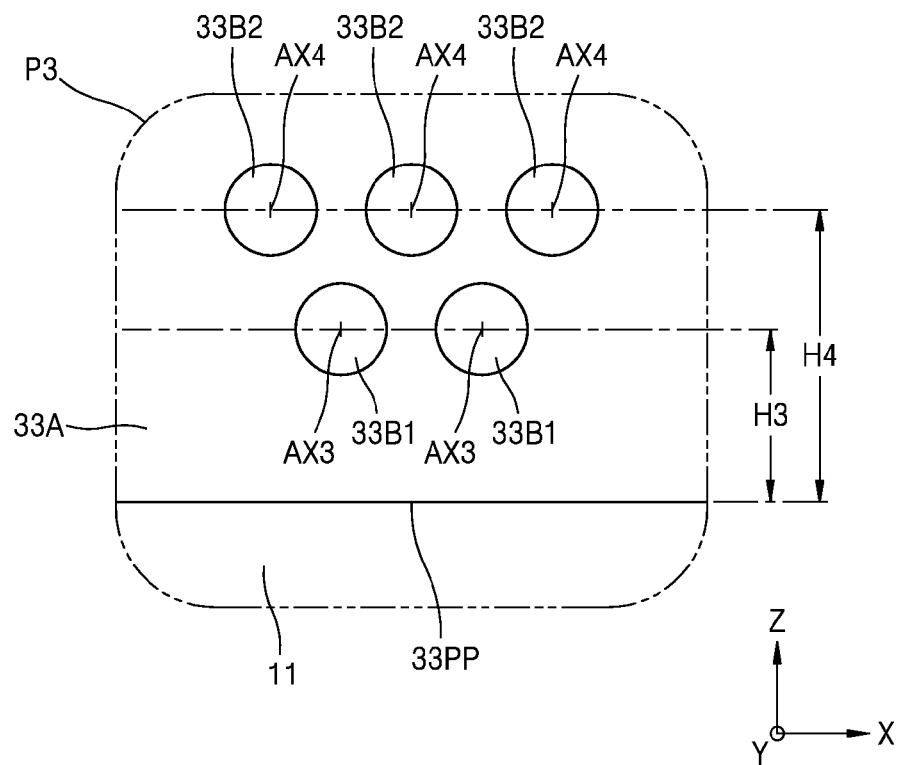
FIGS. 3B and 3C respectively are a cross-sectional view and a plan view depicting an area P3 of the package board indicated in FIG. 3B.
Figure 3C:
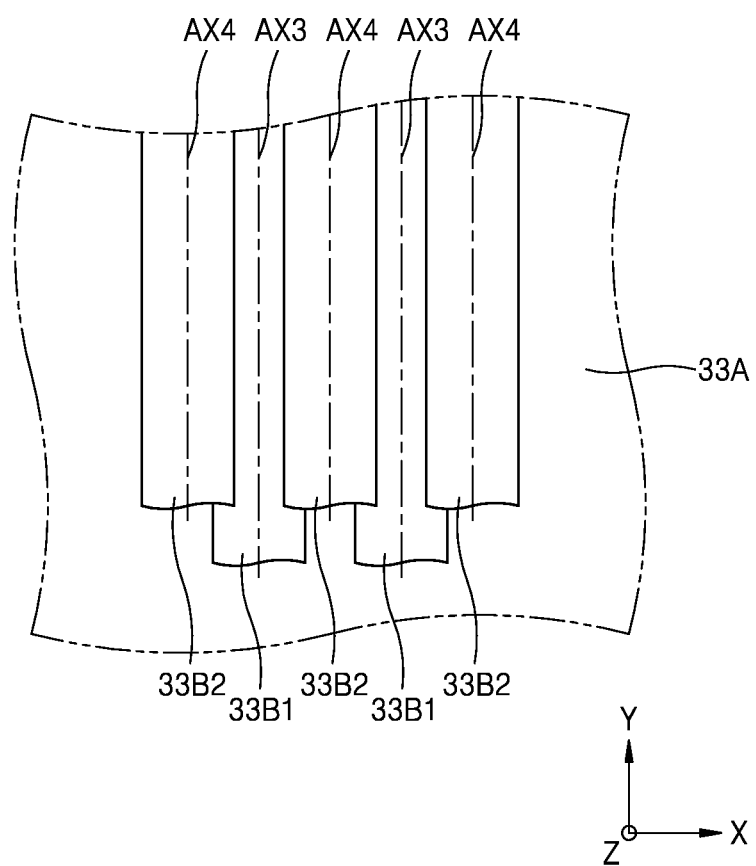

FIG. 3A is a cross-sectional view of a package board 30 according to an exemplary embodiment. FIGS. 3B and 3C respectively are a cross-sectional view and a plan view depicting an area P3 of the package board 30 indicated in FIG. 3B. The package board 30 is similar to the package board 20 of FIGS. 2A and 2B, but is different from the package board 20 insofar as first fibers 33B of the package board 30 arranged at levels H3 and H4 that do not overlap each other in a third direction (a Z direction).

Referring to FIGS. 3A to 3C, a fiber layer 33 may include a second insulating layer 33A covering the circuit layer 11, and the first fibers 33B within the second insulating layer 33A. The first fibers 33A may be spaced apart from each other and extend parallel or substantially parallel to each other in a first direction (the Y direction). The first fibers 33B may be non-woven fibers.

Second regions 33R2 arranged on both sides of a first region 33R1 may each include, for example, five first fibers 33B. The first fibers 33B may be first-level fibers 33B1 and second-level fibers 33B2. The first-level fibers may have a first axis AX3, which is a central axis and which is located at a first level H3 from a main surface 33PP of the fiber layer 33. The second-level fibers 33B2 may have a second axis AX4, which is central axis and which is located at a second level H2 higher than the first level H1.

In this case, the first axis AX3 and the second axis AX4 may be arranged to not overlap each other in the third direction (the Z direction). That is, the first axis AX3 and the second axis AX4 may be alternately arranged with respect to a second direction (the X direction). In this case, since the second-level fibers 33R2 may be arranged in a space between the first-level fibers 33B1, the number of first fibers 33B arranged per unit volume in a limited space may increase. As the number of first fibers 33B included in the package board 10 increases, bending stiffness of the package board 10 may be correspondingly increased.

Figure 4A:
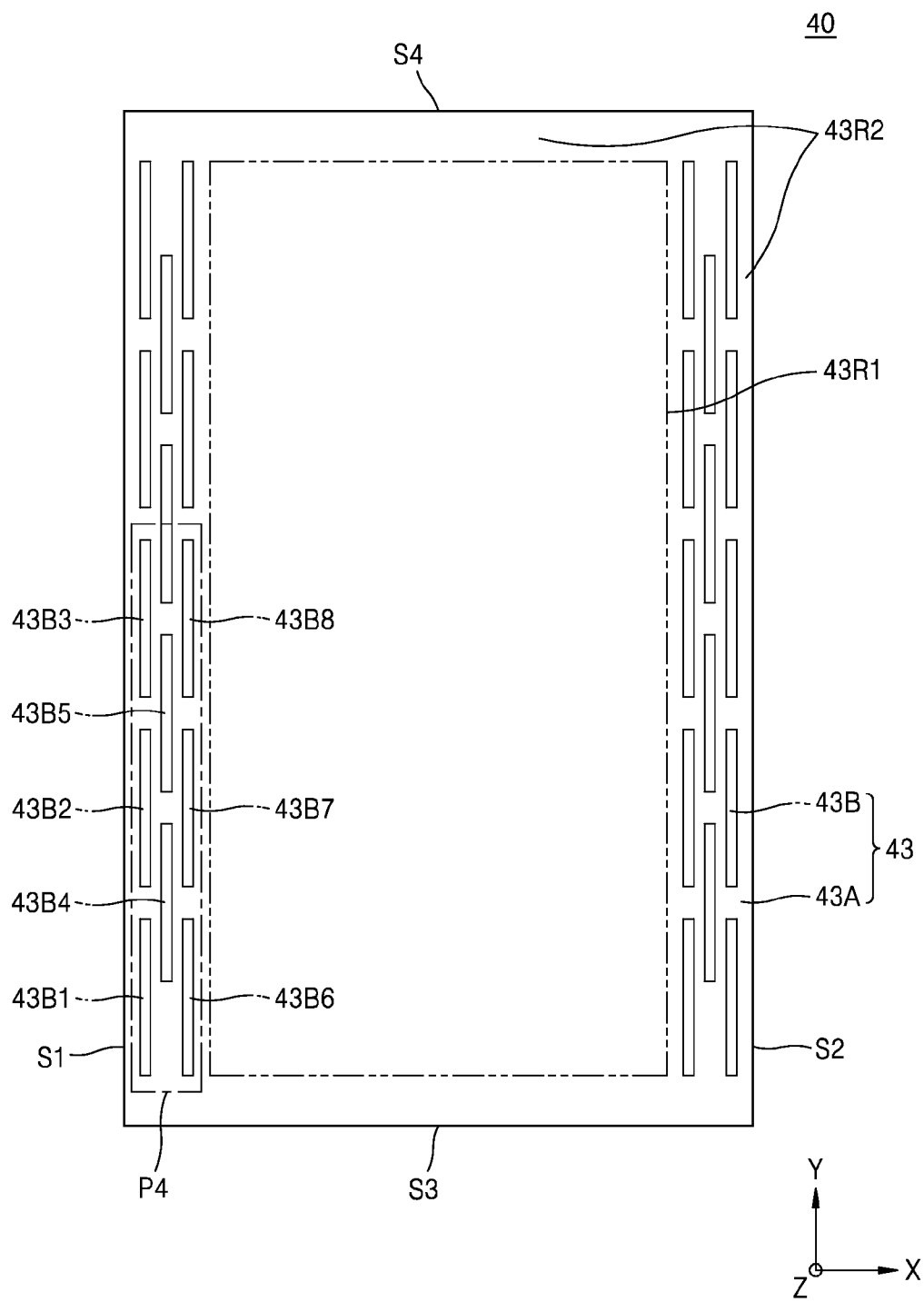
FIG. 4A is a plan view of a package board according to an exemplary embodiment.
Figure 4B:
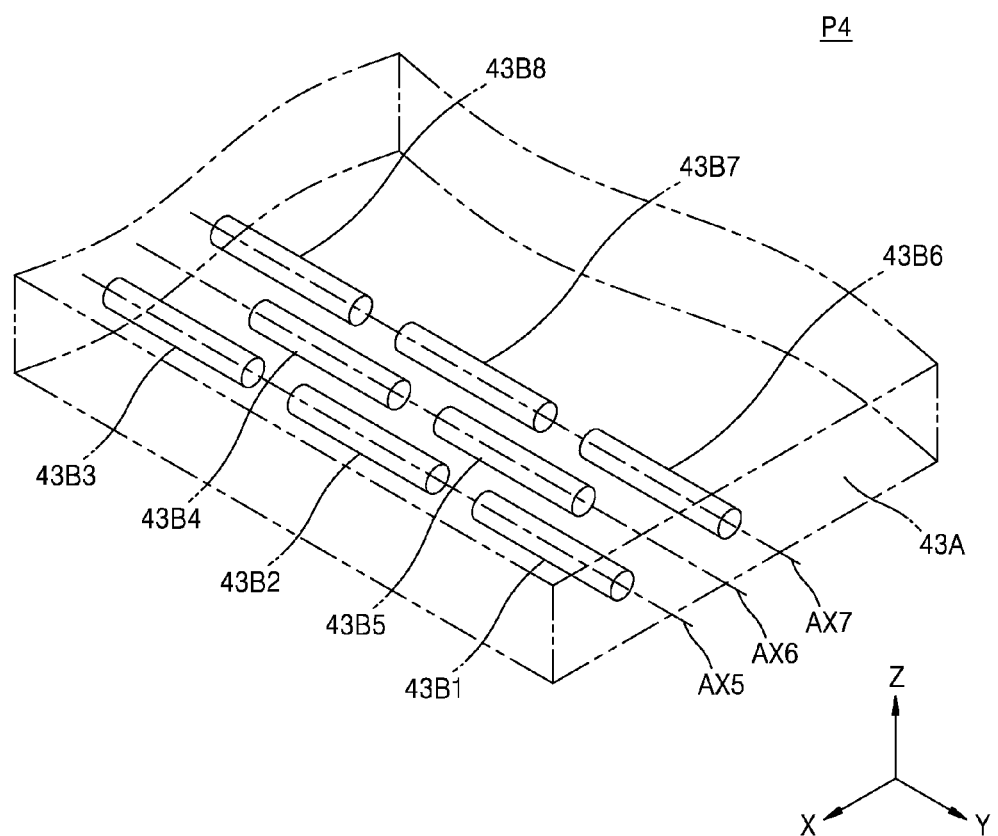
FIG. 4B is a phantom perspective view depicting an area P4 of the package board indicated in FIG. 4A.

FIG. 4A is a plan view of a package board 40 according to an exemplary embodiment. FIG. 4B is a phantom perspective view depicting an area P4 of the package board 40 indicated in FIG. 4A. The package board 40 is similar to the package board 10 of FIG. 1, but is different from the package board 10 insofar as first fibers 43B of the package board 40 that have the same central axis are arranged in a discontinuous manner That is, the first fibers 43B of the package board 40 may have a discontinuous, segmented arrangement in which a particular fiber does not extend continuously along an axis like the fibers 13B of the package board 10.

Referring to FIGS. 4A and 4B, a fiber layer 43 may include a second insulating layer 43A and the first fibers 43B, which include first-axis fibers 43B1 to 43B3, second-axis fibers 43B4 and 43B5, and third-axis fibers 43B6 to 43B8. The first-axis to third-axis fibers 43B1 to 43B8 are spaced apart from each other and extend in a first direction (the Y direction) within the second insulating layer 43A. Among the first fibers 43B, first-axis fibers 43B1 to 43B3 have a first axis AX5 that extends in the first direction (the Y direction) at centers of the first-axis fibers 43B1 to 43B3. The first-axis fibers 43B1 to 43B3 may be arranged in a discontinuous, segmented manner. Second-axis fibers 43B4 and 43B5 have a second axis AX6, which extends in the first direction (the Y direction) at centers of the second-axis fibers 43B4 and 43B5 and which is different from the first axis AX5,. The second-axis fibers 43B4 and 43B5 may be arranged in a discontinuous, segmented manner Likewise, third-axis fibers 43B6 to 43B8 have a third axis AX7, which extends in the first direction (the Y direction) at centers of the third-axis fibers 43B6 to 43B8 and which is different from the first axis AX5 and second axis AX6,. The third-axis fibers 43B6 to 43B8 may be arranged in a discontinuous, segmented manner In this case, the first-axis fibers 43B1 to 43B3, second-axis fibers 43B4 and 43B5, and third-axis fibers 43B6 to 43B8 may be spaced apart from each other and arranged to be parallel or substantially parallel to each other. The first fibers 43B may be non-woven fibers. Additionally, the respective lengths of the first-axis fibers 43B1 to 43B3, the second-axis fibers 43B4 and 43B5, and the third-axis fibers 43B6 to 43B8 may be substantially the same or may be different.

FIGS. 4A and 4B show that each of second regions 43R2 that are arranged on both sides of a first region 43R1 has the first fibers 43B that have three axes that extend along three parallel or substantially parallel axes and are arranged in a discontinuous, segmented manner, but the inventive concept is not limited thereto. In some exemplary embodiments, the first fibers 43B respectively included in the second regions 43R2 that are arranged on both sides of the first region 43R1 may have a single axis or multiple axes (i.e., may extend along a single axis or extend along different parallel or substantially parallel axes) that are formed at different levels and may be arranged in a discontinuous, segmented manner In a section including the first-axis fibers 43B1 to 43B3, the second-axis fibers 43B4 and 43B5, and the third-axis fibers 43B6 to 43B8, which are arranged in a discontinuous, segmented manner, the first-axis fibers 43B1 to 43B3, the second-axis fibers 43B4 and 43B5, and the third-axis fibers 43B6 to 43B8 may be arranged such that at least two from among the first-axis fibers 43B1 to 43B3, the second-axis fibers 43B4 and 43B5, and the third-axis fibers 43B6 to 43B8 do not overlap each other in a direction that is perpendicular to the first direction (the Y direction) (which is a direction in which the first fibers 43B extend). That is, in a section including the first-axis fibers 43B1 to 43B3, the second-axis fibers 43B4 and 43B5, and the third-axis fibers 43B6 to 43B8, at least one portion of the section may be supported by fibers having an axis that is different from the axis of other fibers in the same section, and thus, warpage of the package board 40 may be reduced or alleviated in any section of the package board 40.

FIGS. 4A and 4B show four or five first fibers 43B that have different axes, that is, the first to third axes AX5 to AX7, and that are arranged in a discontinuous, segmented manner. However, a different number of fibers may be arranged in a discontinuous, segmented manner depending on necessity.

Figure 5A:
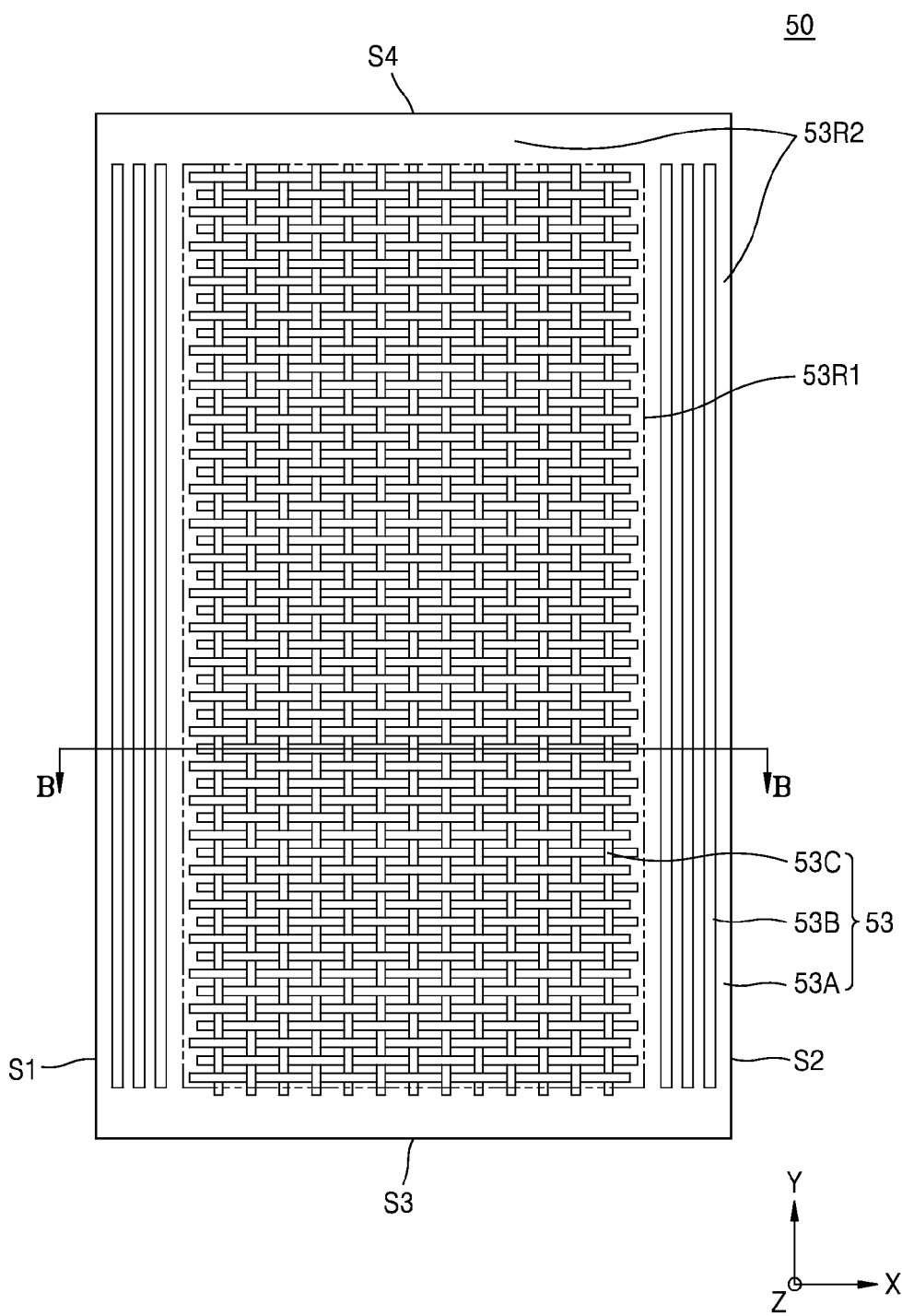
FIGS. 5A and 5B respectively are a plan view and a cross-sectional view of a package board according to one or more exemplary embodiments.
Figure 5B:
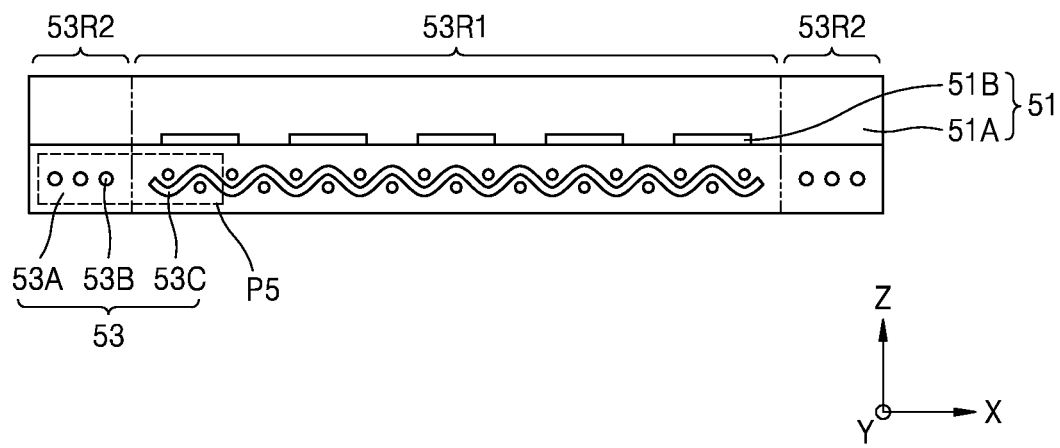
Figure 5C:
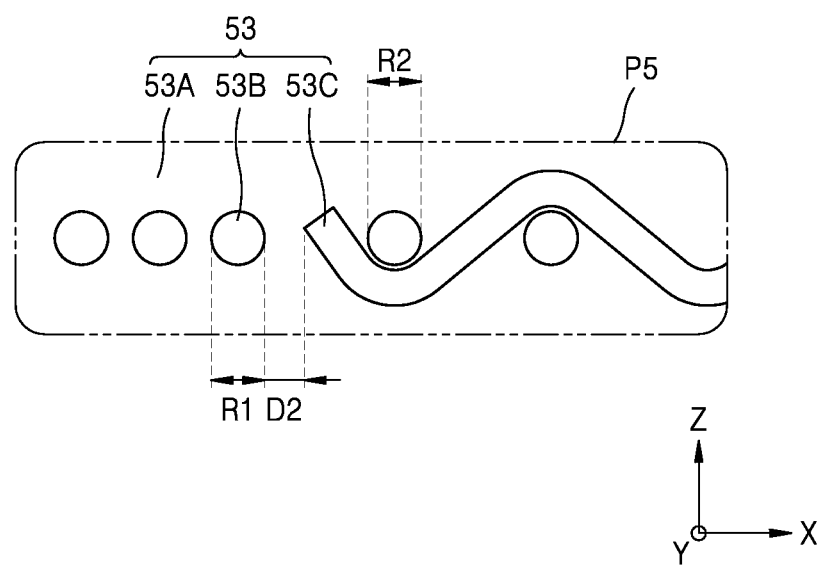
FIG. 5C is a cross-sectional view depicting an area P5 of the package board indicated in FIG. 5A.

FIGS. 5A and 5B respectively are a plan view and a cross-sectional view of a package board 50 according to one or more exemplary embodiments. FIG. 5B is a main part of a cross-section taken along a line B-B indicated in FIG. 5A. FIG. 5C is a cross-sectional view of an area P5 indicated in FIG. 5B of the package board 50. The package board 50 is similar to the package board 10 of FIG. 1, but is different from the package board 10 insofar as the package board 50 includes second fibers 54C that are woven fibers.

Referring to FIGS. 5A and 5B, the package board 50 may include a circuit layer 51 and a fiber layer 53 forming a stack structure with the circuit layer 51.

The circuit layer 51 may include circuit patterns 51B and a first insulating layer 51A in which the circuit patterns 51B are enclosed. The circuit patterns 51B may be densely arranged in a central portion of the first insulating layer 51A which is a certain distance or space from edge portions of the first insulating layer 51A, but the inventive concept is not limited thereto. The circuit patterns 51B may be variously arranged based on particular circuit connections of the circuit patterns 51B.

The fiber layer 53 may be formed on a surface of the circuit layer 51 to cover exposed surfaces of the circuit patterns 51B. The fiber layer 53 may include a second insulating layer 53A covering the circuit layer 51, at least one first fiber 53B and second fibers 53C. The at least one first fiber 53B and the second fibers 53C are formed within the second insulating layer 53A.

The fiber layer 53 may include a first region 53R1 that overlaps a region where the circuit patterns 51B are formed, and second regions 53R2 that are different from the first region 53R1. The first fiber 53B may have, as a central axis, that is, an axis extending in a first direction (the Y direction) along edges of the second insulating layer 53A in the second regions 53R2. The first fibers 53B may extend in parallel or substantially parallel to each other and may be non-woven fibers. In some exemplary embodiments, the first fibers 53B may be sequentially arranged in a third direction (the Z direction) at different levels in the second regions 53R2. Also, the first fibers 53B may have the same axis and may be arranged in a discontinuous, segmented manner The second fibers 53C may respectively extend in the first direction (the Y direction) and a second direction (the X direction), and may be woven together in the first region 53R1, but the inventive concept is not limited thereto. The second fibers 53C may extend in directions that may be freely selected and may be woven fibers. In the drawings, the second fibers 53C, which extend in different directions and are woven fibers, are shown as spaced apart from each other, but may contact each other. Materials forming the second insulating layer 53A may be impregnated between the second fibers 53C. The fiber layer 53 may be formed by processing a prepreg.

The insulating layer 53A including the second fibers 53C and the package board 50 may have a relatively great stiffness. However, since the second fibers 53C are woven fibers having no one primary orientation, it may be difficult to increase stiffness in any particular direction. Nevertheless, since the first fibers 53B extend in parallel to each other in the same direction, for example, the first direction (the Y direction), bending stiffness of the package board 50 in the first direction (the Y direction) may be increased. That is, the fiber layer 53 includes the second fibers 53C and thus may have a relatively great stiffness in all directions, and bending stiffness may be increased in a certain direction by including the first fibers 53B extending in the particular direction.

Therefore, the fiber layer 53 including the first fibers 53B may minimize or prevent warpage of the package board 50.

Referring to FIG. 5C, the second fibers 53C are separated from the first fibers 53B, and the second insulating layer 53A may fill spaces between the first fibers 53B and the second fibers 53C.

A distance D2 between the first fibers 53B and the second fibers 53C may be substantially the same as or smaller than either a diameter R1 of the first fibers 53B or a diameter R2 of the second fibers 53C. The number of the first fibers 53B per unit volume may be increased by decreasing the distance D2 between the first fibers 53B and the second fibers 53C.

The circuit patterns 51B may be electrically connected to a semiconductor device (not shown) that is arranged on the package board 50. In this case, a semiconductor device formed on the fiber layer 53 or circuit layer 51 may be electrically connected to the circuit patterns 51B via an open area formed in the fiber layer 53 or in first insulating layer 51A. A conductive composite may be formed in the open area.

The package board 50 may be completed by manufacturing the circuit layer 51 after forming the circuit patterns 51B in the first insulating layer 51A, and then by forming the fiber layer 53 on a portion of the circuit layer 51.

The fiber layer 53 may be formed by arranging and pressing the second fibers 53C and first fibers 53B between a first preliminary insulating layer and a second preliminary insulating layer. In this case, the second fibers 53C may be in a thin woven fabric form and may be arranged on the first region 53R1. The first fibers 53B may be arranged to extend in the first direction (the Y direction) on the second regions 53R2. The first preliminary insulating layer and second preliminary insulating layer may be used to form the second insulating layer 53A.

The first insulating layer 51A and the second insulating layer 53A each may include a resin composite and may selectively include fillers. Each of the first fiber 53B and the second fiber 53C may include any one of a carbon fiber, an aramid fiber and/or a glass fiber. In some exemplary embodiments, the specific stiffness of the first fiber 53B may be greater than that of the second fiber 53C. For example, the first fiber 53B may include either a carbon fiber or an aramid fiber, and the second fiber 53C may include a glass fiber.

Figure 6:
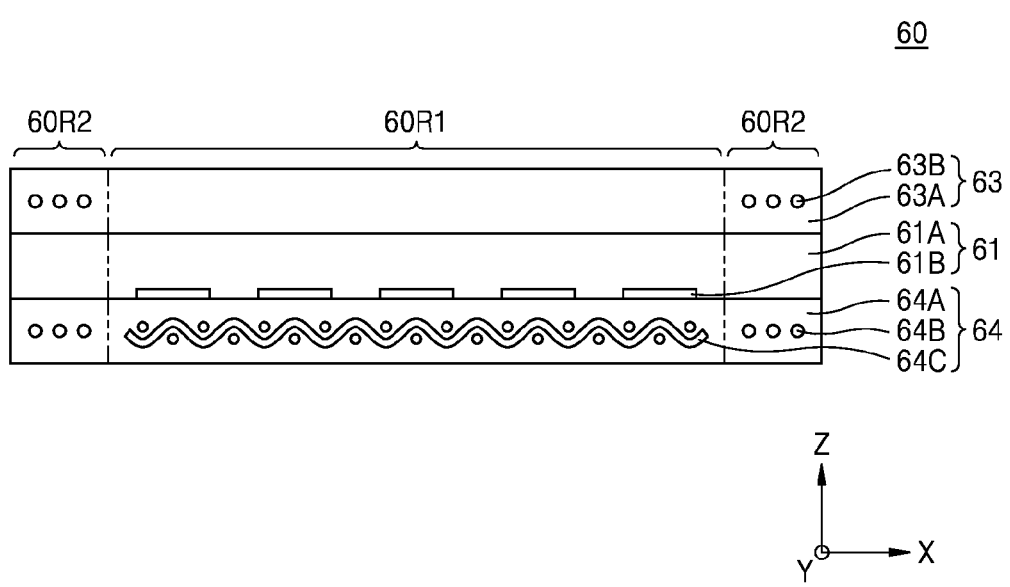
FIG. 6 is a cross-sectional view of a package board according to an exemplary embodiment.

FIG. 6 is a cross-sectional view of a package board 60 according to an exemplary embodiment. The package board 60 is similar to the package board 10 of FIG. 1, but is different from the package board 10 insofar as the package board 60 includes both a first fiber layer 63 that includes first fibers 63B that are non-woven fibers, and a second fiber layer 64 that includes second fibers 64C that are woven fibers.

Referring to FIG. 6, the package board 60 may have a stack structure in which a circuit layer 61, the first fiber layer 63 and the second fiber layer 64 are stacked.

The circuit layer 61 may include circuit patterns 61B and a first insulating layer 61A in which the circuit patterns 61B are enclosed. The circuit patterns 61B may be densely arranged in a central portion of the first insulating layer 61A, which is a certain distance from edge portions of the first insulating layer 61A, but the inventive concept is not limited thereto. The circuit patterns 61B may be variously arranged based on particular circuit connections of the circuit patterns 61B.

The first fiber layer 63 and the second fiber layer 64 may be respectively formed on opposite surfaces of the circuit layer 61. The first fiber layer 63 and the second fiber layer 64 may be separated into a first region 60R1 and second regions 60R2 based on whether the first fiber layer 63 and the second fiber layer 64 overlap the circuit patterns 61B in a third direction (the Z direction). The first region 60R1 may be a region where the first fiber layer 63 and the second fiber layer 64 overlap the circuit patterns 61B in the third direction, and the second regions 60R2 may be regions where the first fiber layer 63 and the second fiber layer 64 do not overlap the circuit patterns 61B in the third direction.

The first fiber layer 63 may include a second insulating layer 63A covering the circuit layer 61, and the first fibers 63B formed within the second insulating layer 63A. The first fibers 63B may be spaced apart from each other and extend in parallel or substantially parallel to each other in a first direction (the Y direction) in the second regions 60R2 where the first fiber layer 63 does not overlap the circuit patterns 61B. Accordingly, an open area may be formed in the first fiber layer 63 without structure of the first fibers 63B. Also, the first fibers 63B formed in the first direction (the Y direction) may increase bending stiffness of the package board 60 in the first direction (the Y direction).

The second fiber layer 64 may include a third insulating layer 64A covering the circuit layer 61, and first fibers 64B and the second fibers 64C formed in the third insulating layer 64A. The first fibers 64B may be spaced apart from each other and extend in parallel or substantially parallel to each other in the first direction (the Y direction) in the second regions 60R2 where the first fiber layer 64 does not overlap the circuit patterns 61B. The second fibers 64C extend in both the first direction (the Y direction) and a second direction (the X direction), and may be woven together in the first region 60R1 where the second fibers 64C overlap the circuit patterns 61B. Accordingly, the second fibers 64C that are the woven fibers increase overall stiffness of the package board 60 in both the first direction (the Y direction) and the second direction (the X direction), and the first fiber layer 63 formed in the first direction (the Y direction) may increase bending stiffness of the package board 60 in the first direction (the Y direction).

Figure 7A:
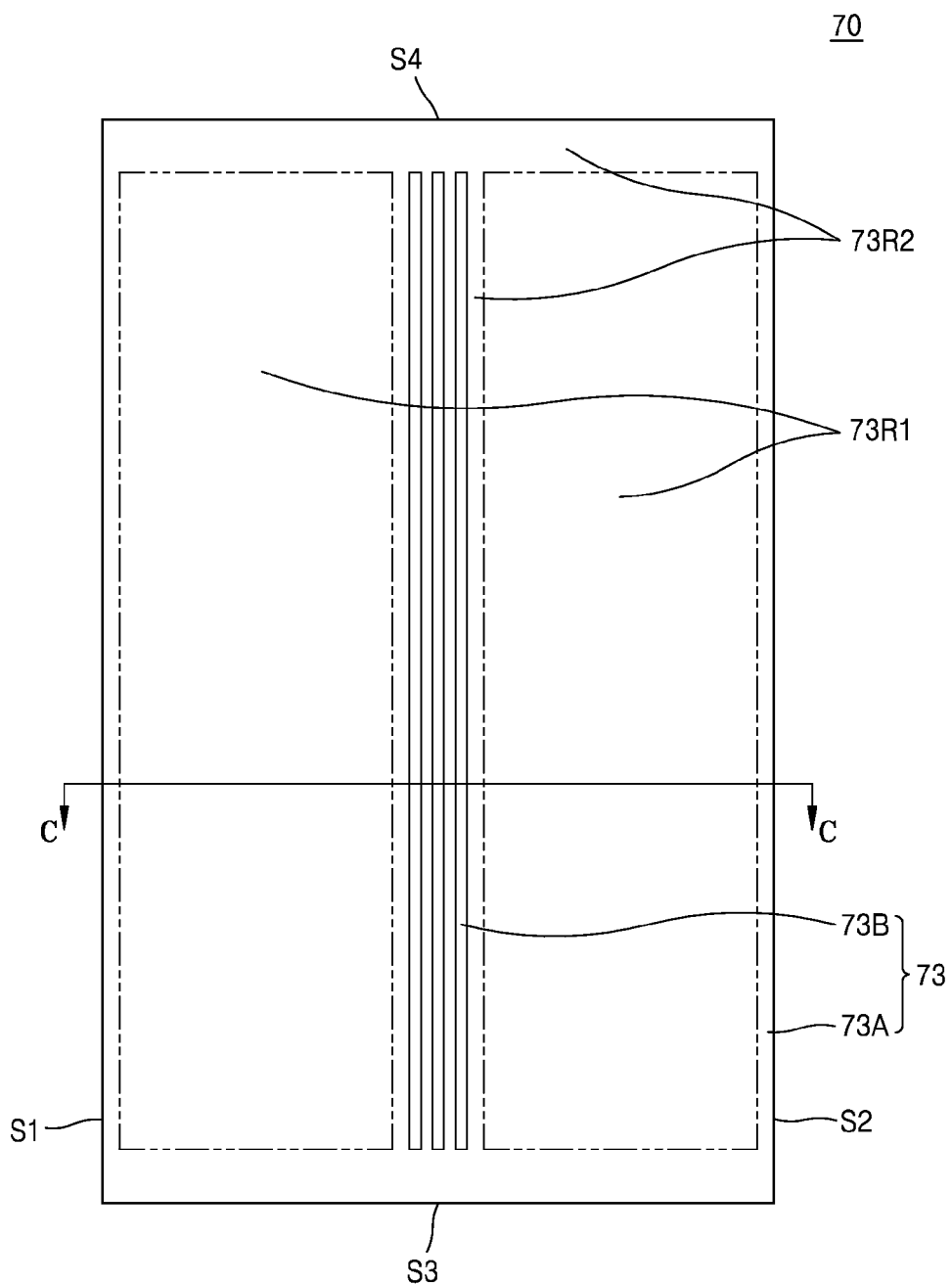
FIGS. 7A and 7B respectively are a plan view and a cross-sectional view of a package board according to one or more exemplary embodiments.
Figure 7B:
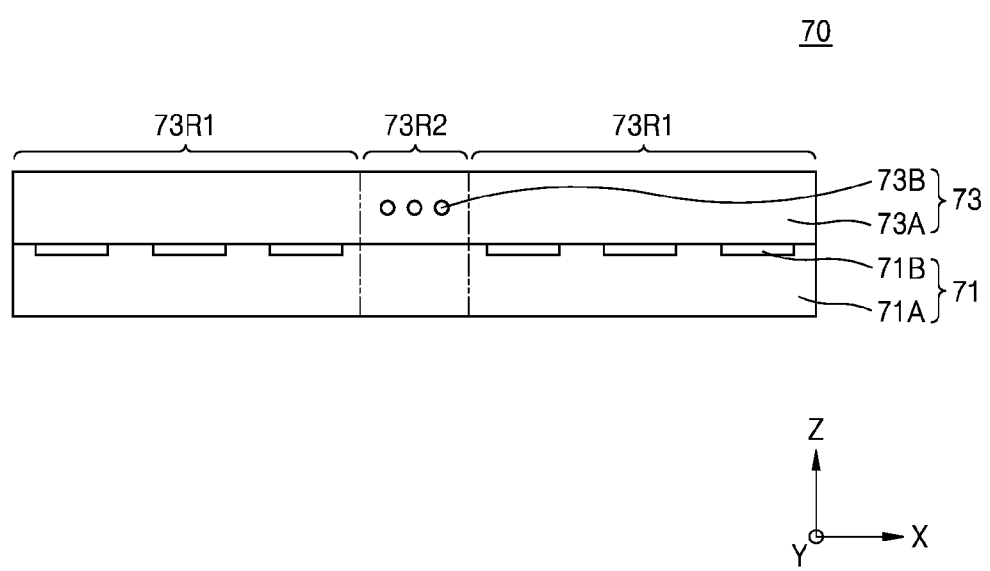

FIGS. 7A and 7B respectively are a plan view and a cross-sectional view of a package board 70 according to an exemplary embodiment. The package board 70 is similar to the package board 10 of FIG. 1, but is different from the package board 10 insofar as first fibers 73B are formed in a central portion of the package board 70 instead of in the edge portions of the package board 70.

Referring to FIGS. 7A and 7B, the package board 70 may include a circuit layer 71 and a fiber layer 73. The circuit layer 71 may include a first insulating layer 71A and circuit patterns 71B formed within the first insulating layer 71A. The circuit patterns 71B may be formed in the central portion of the first insulating layer 71A at relatively small intervals or spaces between the circuit patterns 71B. In this case, the circuit patterns 71B may be formed close to edge portions of the first insulating layer 71A.

The fiber layer 73 may be formed on an insulating layer 71. The fiber layer 73 may include a second insulating layer 73A, and first fibers 73B extending in a first direction (the Y direction) within the second insulating layer 73A. The fiber layer 73 may be divided into a first region 73R1 that overlaps the circuit patterns 71B and a second region 73R2 that does not overlap the circuit patterns 71B. In this case, the first fibers 73B may be formed in the second region 73R2, that is, a central portion of the second insulating layer 73A.

Figure 8:
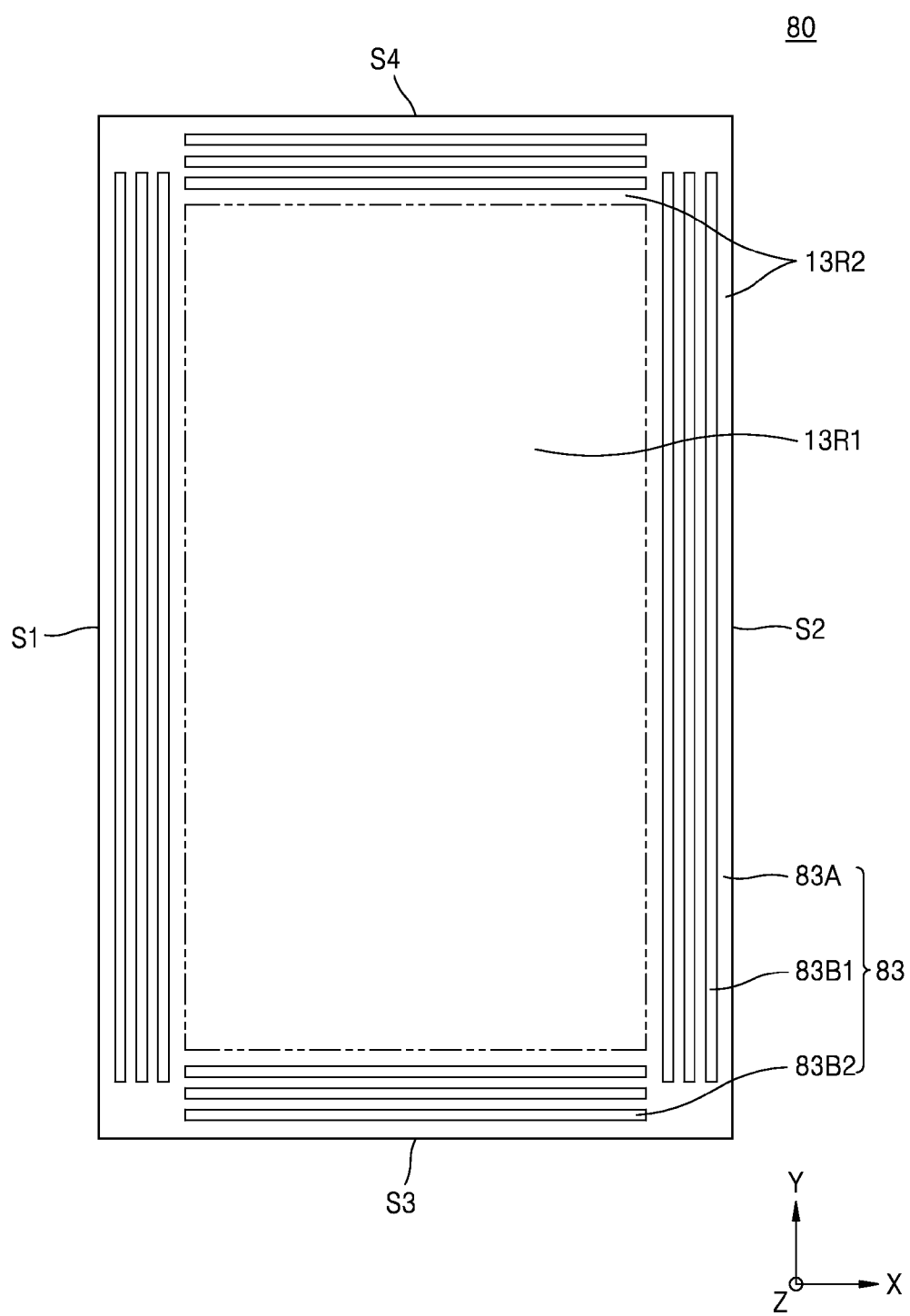
FIG. 8 is a plan view of a package board according to an exemplary embodiment.

FIG. 8 is a plan view of a package board 80 according to an exemplary embodiment. The package board 80 is similar to the package board 10 of FIG. 1, but is different from the package board 10 insofar as first fibers 83B are formed in edge portions that are adjacent to the third side S3 and adjacent to the fourth side S4 of the package board 10 (i.e., the short sides of the package board 10).

Referring to FIG. 8, a fiber layer 83 included in the package board 80 may have first and second sides S1 and S2 that are long sides, and third and fourth sides S3 and S4 that are short sides. In this case, the fiber layer 83 may include a first unidirectional fiber 83B1 formed in regions that are adjacent to the first and second sides S1 and S2 and extending in a first direction (the Y direction), and a second unidirectional fiber 83B2 formed in regions that are adjacent to the third and fourth sides S3 and S4 and extending in a second direction (the X direction). In this case, the fiber layer 83 may include a first region 13R1 overlapping a circuit pattern (not shown), and second regions 13R2 that do not overlap the circuit pattern. The first and second unidirectional fibers 83B1 and 83B2 may be arranged in the second regions 13R2 that are edge portions of the package board 80.

Figure 9:
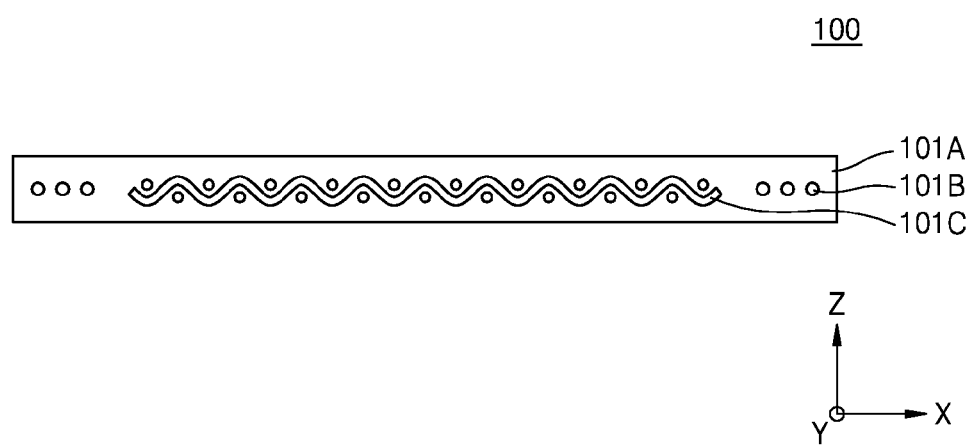
FIG. 9 is a cross-sectional view of a prepreg according to an exemplary embodiment.

FIG. 9 is a cross-sectional view of a prepreg 100 according to an exemplary embodiment.

Referring to FIG. 9, the prepreg 100 may include an insulating layer 101A, at least one first fiber 101B formed within the insulating layer 101A, and second fibers 101C. The prepreg 100 may be in a state in which the fiber layer 53 shown in FIGS. 5A to 5C is processed. Therefore, a structure in which the insulating layer 101A, the first fiber 101B, and the second fibers 101C are stacked is as described in connection with FIGS. 5A to 5C.

The insulating layer 101A may not be completely hardened. That is, the prepreg 100 may be a material that is cured from an A stage, in which is the material is non-cured or in a liquid state, to a B stage in which the material is in a half-cured state. When the prepreg 100 is completely cured and reaches a C stage, the fiber layer 53 of FIGS. 5A to 5C may be formed.

As the prepreg 100 including the first fiber 101B and the second fibers 101C is included in a package substrate, bending stiffness in all directions and any particular direction of the package substrate may simultaneously increase. Accordingly, bending of the package substrate may be improved.

While the inventive concept has been particularly shown and described with reference to exemplary embodiments thereof, it will be understood that various changes in form and details may be made therein without departing from the spirit and scope of the following claims.

What is claimed is:

1. A package board, comprising:
a circuit layer having a circuit pattern; and
a fiber layer including at least one first fiber that extends in a first direction and is a non-woven fiber,
wherein the fiber layer is stacked on a top surface of the circuit layer,
wherein the at least one first fiber of the fiber layer, non-overlapped with the circuit pattern of the circuit layer, is interposed between the top surface of the circuit layer and a top surface of the fiber layer,
wherein the fiber layer comprises a first region, which overlaps a region where the circuit pattern is formed within the circuit layer, and a second region, which overlaps a region where the circuit pattern is not formed within the circuit layer,
wherein the at least one first fiber is formed in the second region, wherein the first direction is substantially a same direction in which a first side of the package board extends, and wherein the second region of the fiber layer comprises edge portions that are adjacent to the first side and a second side that is parallel to the first side.

2. The package board of claim 1, wherein the fiber layer does not comprise woven fibers.

3. The package board of claim 1, wherein the package board comprises a long side and a short side, and wherein the first side of the package board is the long side of the package board.

4. The package board of claim 1, wherein the first region comprises a plurality of second fibers that are woven fibers.

5. The package board of claim 4, wherein a stiffness in the first direction of the first fiber is greater than a stiffness in the first direction of the plurality of second fibers.

6. The package board of claim 4, wherein the at least one first fiber and the plurality of second fibers are spaced apart from each other, wherein a diameter of each of the at least one first fiber is equal to a first diameter, wherein a diameter of each of the plurality of second fibers is equal to a second diameter, and wherein distances between the at least one first fiber and the plurality of second fibers are equal to or less than a smaller diameter from among the first diameter and the second diameter.

7. The package board of claim 1, wherein the at least one first fiber is spaced apart from each other and extend substantially parallel to each other, wherein the at least one first fiber has a first diameter, and wherein a distance between two adjacent first fibers of the at least one first fiber is equal to or less than the first diameter.

8. The package board of claim 1, wherein the at least one first fiber is arranged at levels in a second direction that is substantially perpendicular to a main surface of the fiber layer.

9. The package board of claim 8, wherein the at least one first fiber comprises a first-level fiber formed at a first level and a second-level fiber formed at a second level that is different from the first level, and wherein a first axis of the first-level fiber does not overlap a second axis of the second-level fiber in the second direction.

10. The package board of claim 1, wherein the at least one first fiber comprises at least two first-axis fibers that have a first axis extending in the first direction as a central axis and are arranged in a discontinuous, segmented manner.

11. The package board of claim 10, wherein at least one first fiber further comprises at least two second-axis fibers that have a second axis extending in the first direction as a central axis and are arranged in a discontinuous, segmented manner, and wherein the at least two first-axis fibers and at least two second-axis fibers do not overlap each other in a direction that is substantially perpendicular to the first direction.

12. The package board of claim 1, further comprising: a plurality of second fibers that are woven fibers, wherein the at least one first fiber does not comprise a woven fiber.

* * * * *